United States Patent [19]
Lee et al.

[11] Patent Number: 5,665,631
[45] Date of Patent: Sep. 9, 1997

[54] SOI SUBSTRATE MANUFACTURING METHOD

[75] Inventors: Byoung-hun Lee, Suwon; Chi-jung Kang, Seoul; Kyung-wook Lee, Seongnam; Gi-ho Cha, Suwon, all of Rep. of Korea

[73] Assignee: Samsung Electronics Co., Ltd., Suwon, Rep. of Korea

[21] Appl. No.: 563,803

[22] Filed: Nov. 28, 1995

[30] Foreign Application Priority Data

May 11, 1995 [KR] Rep. of Korea .................. 95-11622

[51] Int. Cl.⁶ .................................................. H01L 21/76
[52] U.S. Cl. ......................................... 438/459; 438/938
[58] Field of Search ................................ 437/62, 86, 974; 148/DIG. 12, DIG. 135; 156/629.1, 630.1, 632.1

[56] References Cited

U.S. PATENT DOCUMENTS

| | | |
|---|---|---|
| 5,032,544 | 7/1991 | Ito et al. . |
| 5,071,785 | 12/1991 | Nakazato et al. . |
| 5,238,875 | 8/1993 | Ogino . |
| 5,308,776 | 5/1994 | Gotou . |
| 5,494,849 | 2/1996 | Iyer et al. . |

FOREIGN PATENT DOCUMENTS

| | | |
|---|---|---|
| 4-116816 | 4/1992 | Japan . |
| 6-275525 | 9/1994 | Japan . |

*Primary Examiner*—George Fourson

[57] ABSTRACT

A SOI substrate manufacturing method which corrects the warpage in the SOI substrate by varying the thickness of a semiconductor material layer additionally formed over the bonded combination of a semiconductor substrate and supporting substrate.

12 Claims, 2 Drawing Sheets

SOI SUBSTRATE MANUFACTURING METHOD

BACKGROUND OF THE INVENTION

The present invention relates to an SOI (silicon-on insulator) substrate manufacturing method and, more particularly, to an SOI manufacturing method which significantly decreases warpage in the SOI substrate.

In general, a silicon substrate is widely used in the fabrication of semiconductor devices. However, silicon substrate based devices suffer from several problems.

First, use of a silicon substrate makes shallow junction-formation in source and drain regions of a transistor difficult. This problem is an obstacle to the realization more highly integrated semiconductor devices. This problem also precludes reduction of the parasitic junction capacitance apparent in the silicon substrate between source and drain regions of the transistor. These disabilities make further improvement in the electrical performance characteristics of the semiconductor device difficult, and in particular impair advances in operating speed.

Second, semiconductor devices typically include a well within the silicon substrate which accommodates a transistor cell, or other active device. Such structures result in soft-error rate (SER) difficulties.

Third, fabrication of semiconductor devices having CMOS transistors formed in a silicon substrate gives rise to the latch-up phenomenon.

Since semiconductor devices manufactured with silicon substrates exhibit these problems, there is an increasing tendency to replacing the silicon substrate with a SOI substrate. Use of a SOI substrate in the fabrication of a semiconductor device overcomes many of these problems. These improvements can generally be attributed to the structure of the SOI substrate which includes an oxidized layer, a supporting substrate below the oxidized layer and a semiconductor layer having a thickness of 0.5 μm or less overlaying the oxidized layer.

More particularly, since the thickness of the semiconductor layer corresponds to the junction depth of the source and drain regions, a thin junction can readily be obtained by adjusting the thickness of the semiconductor layer. In addition, the respective bottoms of the source and drain regions contact the oxidized layer, thus decreasing the parasitic junction capacitance. This improvement contributes to increases in the operating speed of the semiconductor device. Full isolation of active devices such as a transistor by an insulating layer can also be achieved by use of a SOI substrate. Full isolation entirely eliminates the latch-up problem inherent in CMOS structures formed in silicon substrates.

FIGS. 1A and 1B are cross-sectional views which illustrate a manufacturing method for a conventional SOI substrate. FIG. 1A shows the bonding of a supporting substrate 10 with a semiconductor substrate 14. The bonding step is performed by forming an oxidized layer 12 on one surface of supporting substrate 10 or on one surface of semiconductor substrate 14, and thereafter bonding supporting substrate 10 and semiconductor substrate 14 by using oxidized layer 12 as the bonding medium. Here, a silicon wafer is widely used for semiconductor substrate 14, and the bonding of supporting substrate 10 and semiconductor substrate 14 is accomplished by use of a high temperature oxidation method, and an electrostatic bonding method, or a method of thermal processing at high temperature in a nitrogen atmosphere.

FIG. 1B shows the completion of the SOI substrate. The completion of the SOI substrate is accomplished by removing an upper portion of semiconductor substrate 14 using a grinding process, and a CMP (chemical-mechanical polishing) process to remove an upper portion of the semiconductor substrate 14 and obtain a finished semiconductor layer 14 a having a desired thickness.

Unfortunately, the grinding process stresses semiconductor substrate 14. More particularly, use of a silicon wafer as semiconductor substrate 14 produces a compressive stress ($S_F$) on the front surface of a SOI substrate. Accordingly, as illustrated by the difference between FIG. 1A and FIG. 1B, SOI substrate 12 warps under the compressive stress of the grinding/polishing processes resulting in an irregular thickness for finished semiconductor layer 14a. During subsequent semiconductor processing such as photolithography processing steps, the warped semiconductor layer 14a makes mask alignment difficult. The warped semiconductor substrate also gives rise to additional stresses thermal processing steps. Such adverse effects may result in the lifting of the semiconductor substrate from SOI substrate.

SUMMARY OF THE INVENTION

The present invention provides a manufacturing method for a SOI substrate which largely relieves the foregoing warpage problem by forming a thin film on the rear surface of a supporting substrate from a stress-controllable material.

To achieve this result, the present invention provides a manufacturing method for a SOI substrate comprising the steps of; bonding a supporting substrate to a semiconductor substrate, forming an oxidized layer over the exposed surfaces of the bonded supporting substrate and semiconductor substrate, forming a semiconductor material layer of first thickness over the oxidized layer, removing an upper portion of the semiconductor substrate and portions of the oxidized layer and semiconductor material layer covering the removed portion of the semiconductor substrate to produce a modified semiconductor substrate having a substantially planar upper surface, and a modified semiconductor material layer having first thickness, and varying the thickness of the modified semiconductor material layer to correct warpage in the upper surface of the modified semiconductor substrate.

BRIEF DESCRIPTION OF THE DRAWINGS

The recited benefits and other advantages of the present invention will become more apparent upon consideration of a preferred embodiment with reference to the attached drawings in which.

DETAILED DESCRIPTION OF THE INVENTION

An embodiment of the present invention will be described in detail, referring to FIGS. 2A to 2E.

Figure 1A:
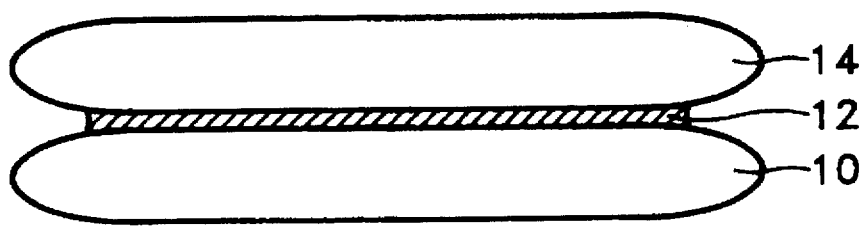
FIGS. 1A and 1B are cross-sectional views for explaining a manufacturing method of a SOI substrate by a conventional technology.
Figure 1B:
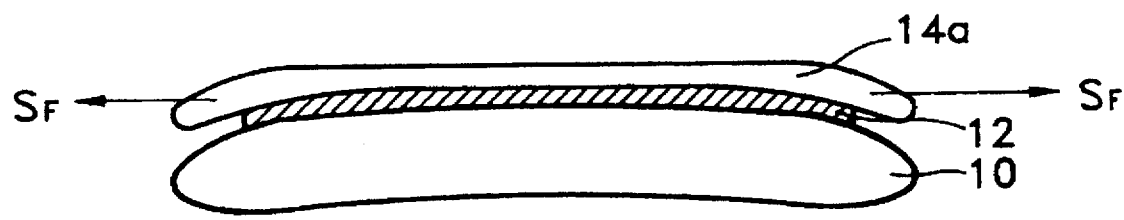
Figure 2A:
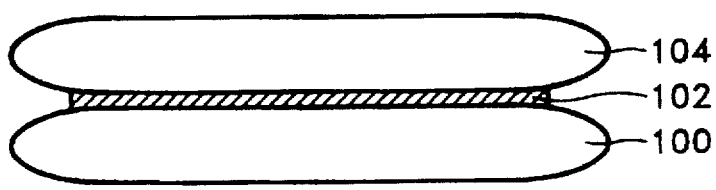
FIGS. 2A to 2E are cross-sectional views for explaining a manufacturing method of a SOI substrate according to the present invention.

FIG. 2A illustrates a step of bonding a supporting substrate 100 and a semiconductor substrate 104. The bonding step is performed by forming a first oxidized layer 102 on one or both surfaces of the supporting substrate 100 or semiconductor substrate 104, and thereafter bonding supporting substrate 100 to semiconductor substrate 104 together using first oxidized layer 102 as the bonding medium. Bonding of supporting substrate 100 and semiconductor substrate 104 is preferably done using a high temperature oxidation method, an electrostatic bonding method, or a method of high temperature thermal processing in a nitrogen atmosphere. Silicon wafers are used for supporting substrate 100 and/or semiconductor substrate 104.

Figure 2B:
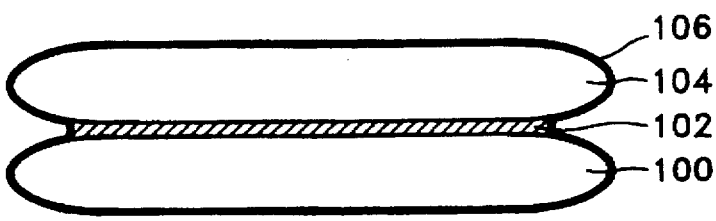

FIG. 2B illustrates a step of forming a second oxidized layer 106 on the exposed surfaces of supporting substrate 100 and semiconductor substrate 104. Formation of second oxidized layer 106 is preferably done using a wet oxidization process which yields improved bonding adhesion to supporting substrate 100 and semiconductor substrate 104, and which facilitates contact of second oxidized layer 106 with a semiconductor material layer in a subsequent process step.

Figure 2C:
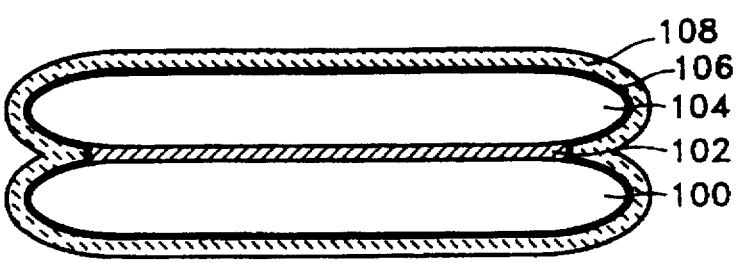

FIG. 2C illustrates a step of forming a semiconductor material layer 108. Semiconductor material layer 108 having a first thickness is deposited over the surface of second oxidized layer 106. Here, semiconductor material layer 108 is formed from a material having reactive stress characteristics similar to, or identical to, semiconductor substrate 104. For example, where semiconductor substrate 104 is a silicon wafer, semiconductor material layer 108 is preferably formed of polysilicon. In this manner, the warpage induced by subsequent processing of the semiconductor substrate 104 can be controlled by the selection and processing alteration of the semiconductor material layer 108.

Figure 2D:
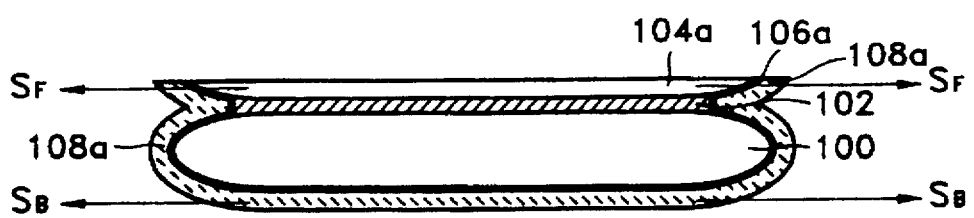

FIG. 2D illustrates the next step in the formation of a SOI substrate according to the present invention. An upper portion of semiconductor material layer 108 formed on the surface of semiconductor substrate 104, an upper portion of second oxidized layer 106 and the upper part of semiconductor substrate 104 are successively etched away. Here, a grinding process can serve as the etching means. Thus, a modified semiconductor material layer 108a, a modified second oxidized layer 106a, and a modified semiconductor substrate 104a are formed of the residual portions of semiconductor material layer 108, second oxidized layer 106, and semiconductor substrate 104, respectively.

Here, modified semiconductor layer 104a offers an active region which may accommodate subsequently formed semiconductor devices. Thus, the final thickness of modified semiconductor layer 104a is closely related to the desired properties of these anticipated devices to be formed therein. The respective, desired thickness of modified semiconductor layer 104a, as well as the desired thickness of first oxidized layer 102 are critical to the determination of the initial thickness of semiconductor material layer 108, and to the ultimate thickness of modified semiconductor layer 108a.

That is, SOI substrate warpage can be prevented when the processing-induced stress ($S_F$) created in modified semiconductor layer 104a of the SOI substrate is counterbalanced by the opposing stress ($S_B$) induced by the semiconductor material layer 108 on the SOI substrate. This "balancing" can be achieved by selection of the relative thicknesses of modified semiconductor layer 104a, first oxidized layer 102, and semiconductor material layer 108.

The foregoing stress relief allows modified semiconductor layer 104a to maintain a uniform, or planar, thickness during the entire etching and polishing process steps. As a result, precise mask alignment can be obtained in subsequent photolithographic processes performed on the SOI substrate.

Figure 2E:
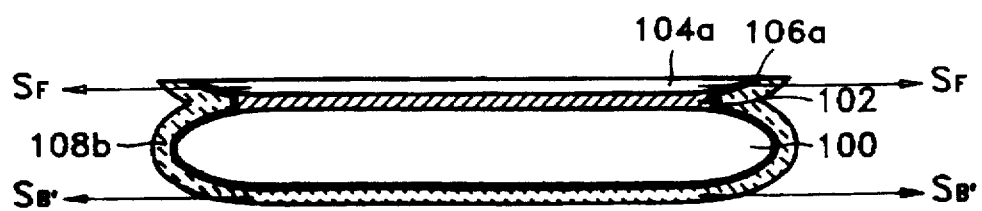

FIG. 2E further illustrates the step of controlling the "flatness" of the final SOI substrate surface, i.e., the step of accurately detecting and controlling warpage in the SOI substrate. Warpage can be detected using a warpage tester which determines the magnitude of bowing (convex or concave) in a semiconductor surface relative to a planar reference axis. As illustrated in FIG. 2E, when the warpage of the SOI substrate formed in FIG. 2D exceeds a desired limit, or when such is to be adjusted to a particular value, the thickness of modified semiconductor material layer will be varied to achieve the desired affect. In other words, the stress $S_B$ induced by modified semiconductor material layer 108a in FIG. 2D, may be altered by varying (increasing or decreasing) the thickness of modified semiconductor material layer 108a to be a desired thickness.

The examples shown in FIGS. 3A and 3B further illustrate this step. In these examples, it is assumed that a polysilicon semiconductor material layer 108 is formed over a silicon semiconductor layer 104. As such, modified semiconductor material layer 108a and modified semiconductor substrate 104a both exhibit compressive stress.

In FIG. 3A, the SOI substrate resulting from steps 2A–2D above has a "concave" surface. In this situation, modified semiconductor material layer 108a will be etched or polished to reduce its thickness (as shown in FIG. 2E) to equalize stresses $S_B$ and $S_F$.

Alternately, in FIG. 3B, the SOI substrate resulting from steps 2A–2D has a "convex" surface. In this situation, more polysilicon material is added to increase the thickness of modified semiconductor material layer 108a (as shown in FIG. 2E) to equalize stresses $S_B$ and $S_F$.

Thus, once the SOI substrate arrives at a state illustrated in FIG. 2E, wherein the resulting structure exhibits unacceptable warpage, it is desirable to reform the thickness of modified semiconductor material layer 108a to correct the warpage. Such thickening or thinning of the modified semiconductor material layer 108a will alter the relief stress ($S_B$) placed on SOI substrate. By this technique, a proper counterbalance may be created.

When modified semiconductor material layer 108a is to be thinned a wet etching method, a dry etching method, or a CMP process may be used. Of these, the CMP process is preferred.

As described above, the present invention has the advantage of allowing one to accurately measure, detect and correct warpage in a SOI substrate by the formation, measurement and reformation of a semiconductor material layer of appropriate thickness. The appropriate thickness is determined by the resulting stress induced upon the SOI substrate, as compared with the processing-stress caused by the formation of the modified semiconductor substrate.

The present invention, thus, provides a the uniform thickness in the resulting semiconductor substrate layer. This uniform thickness allows precise mask alignment in subsequent photolithographic processes, and helps prevent "lift-off" of the semiconductor layer following high temperature thermal processes.

The foregoing embodiment has been given by way of example. Those of ordinary skill in the art will understand that modifications and variations may be made to the foregoing exemplary embodiment without removing such from the spirit and scope of the present invention as set forth in the attached claims.

What is claimed is

1. A method of manufacturing a SOI substrate, comprising the steps of:

bonding a supporting substrate to a semiconductor substrate;

forming an oxidized layer over the exposed surfaces of the bonded supporting substrate and semiconductor substrate;

forming a semiconductor material layer of first thickness over the oxidized layer;

removing an upper portion of the semiconductor substrate and portions of the oxidized layer and semiconductor material layer covering the removed portion of the semiconductor substrate to produce a modified semiconductor substrate having a substantially planar upper surface, and a modified semiconductor material layer having first thickness.

2. The method of manufacturing according to claim 1, further comprising the step of:

varying the thickness of the modified semiconductor material layer to correct warpage in the upper-surface of the modified semiconductor substrate.

3. The method of manufacturing according to claim 2, wherein the step of varying the thickness of the modified semiconductor material layer comprises the substep of depositing additional semiconductor material on the modified semiconductor material layer.

4. The method of manufacturing according to claim 2, wherein the step of varying the thickness of the modified semiconductor material layer comprises the substep of etching away a portion of the first thickness of the modified semiconductor material layer.

5. The method of manufacturing according to claim 4, wherein the substep of etching away a portion of the first thickness of the modified semiconductor material layer is performed using a wet-etching method.

6. The method of manufacturing according to claim 4, wherein the substep of etching away a portion of the first thickness of the modified semiconductor material layer is performed using a dry-etching method.

7. The method of manufacturing according to claim 4, wherein the substep of etching away a portion of the first thickness of the modified semiconductor material layer is performed using a chemical-mechanical polishing method.

8. The method of manufacturing according to claim 2, wherein the semiconductor substrate is formed from a silicon wafer.

9. The method of manufacturing according to claim 3, wherein the semiconductor material layer comprises polysilicon.

10. The method of manufacturing according to claim 2, wherein the step of removing an upper portion of the semiconductor substrate, comprises the substep of grinding away a substantial portion of an initial thickness of the semiconductor substrate.

11. The method of manufacturing according to claim 10, further comprising the step of chemically and mechanically polishing the substantially planar upper surface of the modified semiconductor substrate.

12. The method of manufacturing according to claim 2, wherein the oxidized layer is formed of a thermally oxidized layer using a wet oxidization process.

* * * * *